(12) United States Patent
Imai

(10) Patent No.: US 12,587,145 B2
(45) Date of Patent: Mar. 24, 2026

(54) POWER AMPLIFICATION CIRCUIT

(71) Applicant: Murata Manufacturing Co., Ltd., Kyoto (JP)

(72) Inventor: Shohei Imai, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 461 days.

(21) Appl. No.: 18/182,641

(22) Filed: Mar. 13, 2023

(65) Prior Publication Data

US 2023/0216450 A1     Jul. 6, 2023

Related U.S. Application Data

(63) Continuation of application No. PCT/JP2021/033478, filed on Sep. 13, 2021.

(30) Foreign Application Priority Data

Sep. 14, 2020     (JP) .................................. 2020-153496

(51) Int. Cl.
  *H03F 1/30*     (2006.01)
  *H03F 1/02*     (2006.01)
  *H03F 3/24*     (2006.01)
(52) U.S. Cl.
  CPC ........... *H03F 1/303* (2013.01); *H03F 1/0288* (2013.01); *H03F 3/245* (2013.01); *H03F 2200/451* (2013.01)
(58) Field of Classification Search
  CPC ........ H03F 1/303; H03F 1/0288; H03F 3/245; H03F 2200/451

USPC .......................................................... 330/289
See application file for complete search history.

(56) References Cited

U.S. PATENT DOCUMENTS

| | | | |
|---|---|---|---|
| 5,786,727 A * | 7/1998 | Sigmon ................. | H03F 1/0288 330/124 R |
| 2002/0171138 A1 | 11/2002 | Osone et al. | |
| 2006/0044060 A1 * | 3/2006 | Shiikuma .............. | H03F 1/0288 330/124 R |
| 2006/0106024 A1 * | 5/2006 | Levy ...................... | A61K 31/50 514/400 |
| 2007/0040255 A1 | 2/2007 | Osone et al. | |

(Continued)

FOREIGN PATENT DOCUMENTS

| | | |
|---|---|---|
| JP | 2002-344147 A | 11/2002 |
| JP | 2006-067176 A | 3/2006 |

(Continued)

OTHER PUBLICATIONS

International Search Report for PCT/JP2021/033478 dated Nov. 16, 2021.

*Primary Examiner* — Hafizur Rahman
(74) *Attorney, Agent, or Firm* — McDonald Hopkins LLC

(57)     ABSTRACT

A power amplification circuit including: a power splitter which splits an input signal into a first signal and a second signal; a first carrier amplifier which amplifies the first signal to output a first amplified signal; a first peak amplifier which amplifies the second signal when a power level of the second signal is larger than or equal to a predetermined power level to output a second amplified signal; and a combiner which combines the first amplified signal and the second amplified signal, in which the first carrier amplifier and the first peak amplifier are provided to a same semiconductor substrate.

13 Claims, 7 Drawing Sheets

(56) References Cited

U.S. PATENT DOCUMENTS

| | | | | |
|---|---|---|---|---|
| 2011/0175677 A1* | 7/2011 | Jeong | ................... | H03F 3/195 |
| | | | | 330/124 R |
| 2012/0025915 A1* | 2/2012 | Ui | ...................... | H03F 3/189 |
| | | | | 330/124 R |
| 2019/0149098 A1 | 5/2019 | Tanomura | | |
| 2019/0165739 A1 | 5/2019 | Lyalin et al. | | |
| 2020/0083848 A1* | 3/2020 | Zhou | ................... | H03F 3/3001 |

FOREIGN PATENT DOCUMENTS

| | | | | |
|---|---|---|---|---|
| JP | 2007-266539 A | 10/2007 | | |
| JP | 2019-092009 A | 6/2019 | | |
| WO | WO-2005088830 A1 * | 9/2005 | ........... | H03F 1/0288 |

* cited by examiner

POWER AMPLIFICATION CIRCUIT

CROSS REFERENCE TO RELATED APPLICATION

This is a continuation of International Application No. PCT/JP2021/033478 filed on Sep. 13, 2021 which claims priority from Japanese Patent Application No. 2020-153496 filed on Sep. 14, 2020. The contents of these applications are incorporated herein by reference in their entireties.

BACKGROUND ART

Technical Field

The present disclosure relates to a power amplification circuit.

The Doherty amplifier is a highly-efficient power amplifier. The Doherty amplifier generally has a carrier amplifier and a peak amplifier connected in parallel, the carrier amplifier which operates irrespective of the power level of an input signal, and the peak amplifier which is turned OFF when the power level of the input signal is small and is turned ON when it is large. And, when the power level of the input signal is large, the carrier amplifier operates while maintaining saturation at a saturation output power level (for example, refer to Patent Document 1).

Patent Document 1: U.S. Patent Application Publication No. 2019/0165739

BRIEF SUMMARY

The power amplification circuit according to Patent Document 1 configures a Doherty amplifier including a carrier amplifier and a peak amplifier. In the Doherty amplifier, when a modulated signal is inputted, the carrier amplifier operates always in a saturated state. On the other hand, in the Doherty amplifier, the peak amplifier operates only when the modulated signal exceeds a predetermined power level, and operates in a saturated state only for a short time. That is, in the Doherty amplifier, heat generated at the carrier amplifier is larger than heat generated at the peak amplifier. With this, in the power amplification circuit according to Patent Document 1, there is a fear of an increase in temperature of the carrier amplifier by heat generated at the carrier amplifier.

Thus, the present disclosure is to provide a power amplification circuit which efficiently exhausts heat generated at an amplifying element.

A power amplification circuit according to one aspect of the present disclosure includes: a power splitter which splits an input signal into a first signal, a second signal, a third signal, and a fourth signal; a first carrier amplifier which amplifies the first signal to output a first amplified signal; a first peak amplifier which amplifies the second signal when a power level of the second signal is larger than or equal to a predetermined power level to output a second amplified signal; a second carrier amplifier which amplifies the third signal to output a third amplified signal; a second peak amplifier which amplifies the fourth signal when a power level of the fourth signal is larger than or equal to a predetermined power level to output a fourth amplified signal; and a combiner which combines the first amplified signal, the second amplified signal, the third amplified signal, and the fourth amplified signal. At least three among the first carrier amplifier, the first peak amplifier, the second carrier amplifier, and the second peak amplifier are provided to a same semiconductor substrate.

According to the present disclosure, a power amplification circuit which efficiently exhausts heat generated at an amplifying element can be provided.

DETAILED DESCRIPTION

Structure of Power Amplification Circuit 100 According to Embodiment 1

A power amplification circuit 100 is mounted on, for example, a mobile phone, and is used in order to amplify power of a signal to be transmitted to a base station. The power amplification circuit 100 can amplify, for example, power of signals in communication standards, such as the 2nd Generation Mobile Communication System (2G), the 3rd Generation Mobile Communication System (3G), the 4th Generation Mobile Communication System (4G), the 5th Generation Mobile Communication System (5G), Long Term Evolution (LTE)-Frequency Division Duplex (FDD), LTE-Time Division Duplex (TDD), LTE-Advanced, LTE-Advanced Pro, and the 6th Generation Mobile Communication System (6G). Note that the communication standards for signals amplified by the power amplification circuit 100 are not limited to these. The power amplification circuit 100 amplifies an input signal RFin, and outputs an output signal RFout. The input signal is a Radio-Frequency (RF) signal, and the frequency of the input signal is, for example, on the order of several GHz to several tens of GHz.

Figure 1:
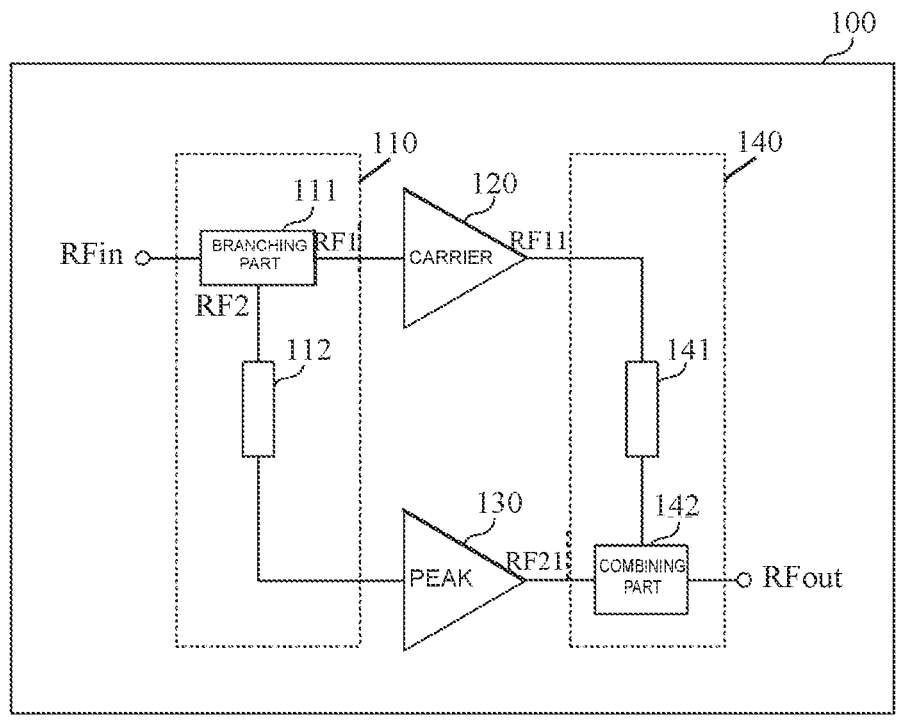
FIG. 1 is a structural diagram depicting one example of structure of a power amplification circuit according to Embodiment 1.

With reference to FIG. 1, the structure of the power amplification circuit 100 according to a first embodiment is described below. FIG. 1 is a structural diagram depicting one example of structure of the power amplification circuit 100 according to Embodiment 1. As depicted in FIG. 1, the power amplification circuit 100 includes, for example, a power splitter 110, a first carrier amplifier 120, a first peak amplifier 130, and a combiner 140.

The power splitter 110 splits the inputted input signal RFin into, for example, a plurality of signals. The power splitter 110 includes, for example, a branching part 111 and a first phase shifter 112. The branching part 111 may be, for example, a balun, a distributed parameter circuit, such as a coupler of a coupling line of 3 dB, a Wilkinson-type power splitter, a web-type power splitter, or the like. The branching part 111 spits the input signal RFin into, for example, a signal RF1 and a signal RF2. The signal RF1 is a signal to be inputted to the first carrier amplifier 120. The signal RF2 is a signal to be inputted through the first phase shifter 112 to the first peak amplifier 130. The first phase shifter 112 is, for example, a phase shifter electrically connected between the branching part 111 and the first peak amplifier 130 to delay the phase of the signal RF2 by approximately 90 degrees. The first phase shifter 112 is configured of, for example, a ¼ wavelength line, a distributed parameter circuit, or the like.

The first carrier amplifier 120, for example, amplifies the inputted signal RF1 to output an amplified signal RF11. The first carrier amplifier 120 is biased to, for example, A class, AB class, or B class. That is, the first carrier amplifier 120 amplifies the inputted signal RF1 to output the amplified signal RF11, irrespective of the power level of the input signal, such as small instantaneous input power.

The first peak amplifier 130, for example, amplifies a signal RF2 inputted through the first phase shifter 112 to output an amplified signal RF21. The first peak amplifier 130 is biased to, for example, C class. The first peak amplifier 130 is an amplifier which operates, for example, in a region in which the power level of the signal RF2 is higher than or equal to a voltage level (or current level) lower than a maximum voltage level Vmax (or maximum current level Imax) of the first carrier amplifier 120 by a predetermined level.

Figure 2:
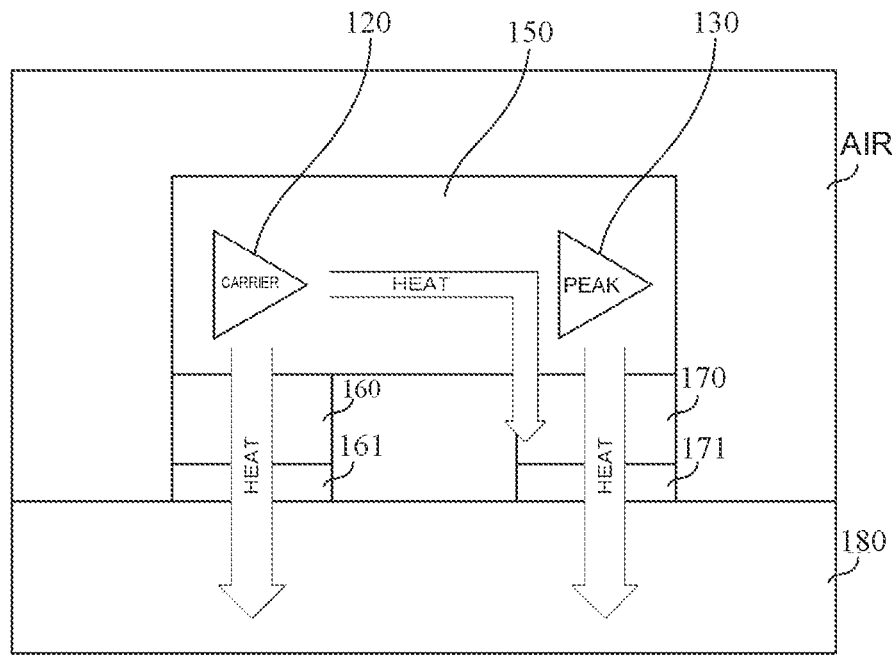
FIG. 2 is a diagram depicting one example of the arrangement and structure of a first carrier amplifier and a first peak amplifier in the power amplification circuit when viewed in the cross section.

Here, the first carrier amplifier 120 and the first peak amplifier 130 are formed on a same semiconductor substrate 150 (refer to FIG. 2). With this, heat generated at the first carrier amplifier 120 can be exhausted by using a route of exhausting heat generated at the first peak amplifier 130. Thus, an increase in temperature at the first carrier amplifier 120 can be decreased. The structure of the first carrier amplifier 120 and the first peak amplifier 130 formed on the same semiconductor substrate 150 will be described below.

The combiner 140 combines, for example, the amplified signal RF11 outputted from the first carrier amplifier 120 and the amplified signal RF21 outputted from the first peak amplifier 130 to output the output signal RFout. The combiner 140 includes, for example, a second phase shifter 141 and a combining part 142. The second phase shifter 141 is, for example, a phase shifter electrically connected between the first carrier amplifier 120 and the combining part 142 to delay the phase of the signal RF11 by approximately 90 degrees. The second phase shifter 141 is configured of, for example, a ¼ wavelength line, a distributed parameter circuit, or the like. To the combining part 142, for example, the amplified signal RF11 outputted from the first carrier amplifier 120 through the second phase shifter 141 and the amplified signal RF21 outputted from the first peak amplifier 130 are inputted. The combining part 142 combines the two signals to output the output signal RFout.

In this manner, in the power amplification circuit 100 according to Embodiment 1, for example, the first carrier amplifier 120 and the first peak amplifier 130 form a Doherty amplification circuit. The carrier amplifier in the Doherty amplification circuit often operates in its saturation region. On the other hand, the peak amplifier less operates in the saturation region, compared with the carrier amplifier. That is, heat generated at the carrier amplifier is larger than heat generated at the peak amplifier. Thus, the power amplification circuit 100 according to the present embodiment has a structure of efficiently exhausting heat generated at the first carrier amplifier 120 by using a route of exhausting heat of the first peak amplifier 130. In the following, heat exhaustion of a power amplification circuit according to a comparative example is described first, and the structure for achieving efficient heat exhaustion at the power amplification circuit 100 is described next.

Power Amplification Circuit According to Comparative Example

Figure 11:
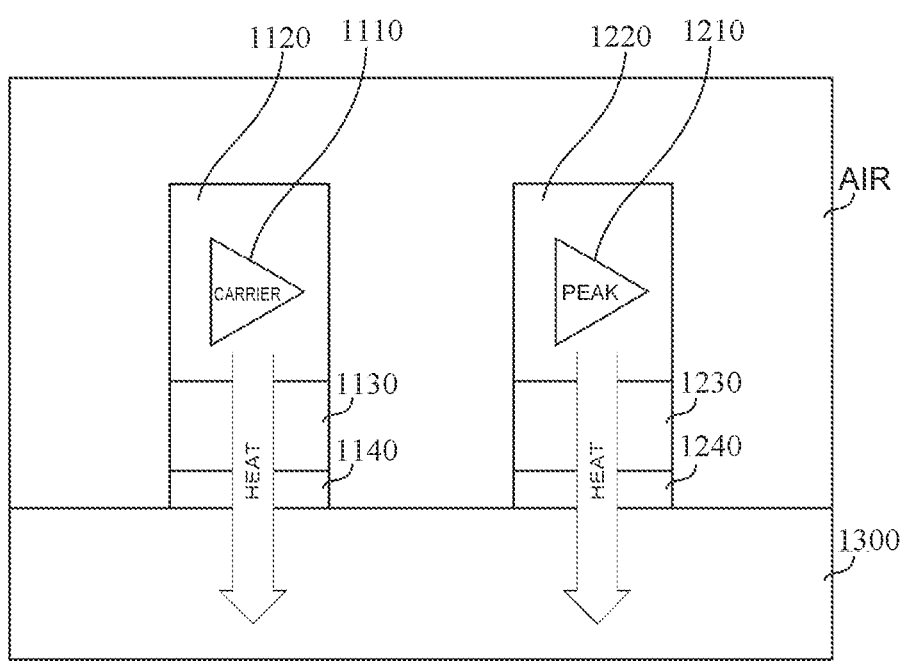
FIG. 11 is a diagram depicting one example of the arrangement and structure of a carrier amplifier and a peak amplifier in a power amplification circuit according to a comparative example when viewed in the cross section.

First, with reference to FIG. 11, a general outline of the arrangement and structure of a carrier amplifier 1110 and a peak amplifier 1210 in the power amplification circuit according to the comparative example is described. FIG. 11 is a diagram depicting one example of the arrangement and structure of the carrier amplifier 1110 and the peak amplifier 1210 in the power amplification circuit according to the comparative example when viewed in the cross section. The power amplification circuit according to the comparative example is depicted in order to help understanding of the power amplification circuit 100 according to the present embodiment. In FIG. 11, a general outline of an exhaust heat route is indicated by an arrow (HEAT).

As depicted in FIG. 11, the carrier amplifier 1110 is formed, for example, on a semiconductor substrate 1120, and is connected through a conductor 1130 and a bump 1140 to a printed board 1300. Also, the peak amplifier 1210 is formed, for example, on a semiconductor substrate 1220 different from the semiconductor substrate 1120 where the carrier amplifier 1110 is formed. The peak amplifier 1210 is connected to the printed board 1300 through, for example, a conductor 1230 and a bump 1240. That is, as depicted in FIG. 11, heat generated at the carrier amplifier 1110 is exhausted to the printed board 1300 only through the conductor 1130 and the bump 1140.

Power Amplification Circuit 100 According to Embodiment 1

With reference to FIG. 2, a general outline of the arrangement and structure of the first carrier amplifier 120 and the first peak amplifier 130 in the power amplification circuit 100 is described. FIG. 2 is a diagram depicting one example of the arrangement and structure of the first carrier amplifier 120 and the first peak amplifier 130 in the power amplification circuit 100 when viewed in the cross section. In FIG. 2, one example of an exhaust heat route is indicated by an arrow (HEAT).

As depicted in FIG. 2, the first carrier amplifier 120 and the first peak amplifier 130 are formed on the same semiconductor substrate 150. The semiconductor substrate 150 is connected to a printed board 180 through, for example, a first conductor 160 and a first bump 161. Also, the semiconductor substrate 150 is connected to the printed board 180 through, for example, a second conductor 170 and a second bump 171. The first conductor 160 and the first bump 161 may be electrically connected to the first carrier amplifier 120, or may mechanically support the semiconductor substrate 150. The second conductor 170 and the second bump 171 may be electrically connected to the first peak amplifier 130, or may mechanically support the semiconductor substrate 150. The number of conductors and bumps between the semiconductor substrate 150 and the printed board 180 is not limited.

With this, in the power amplification circuit 100, heat generated at the first carrier amplifier 120 and the first peak amplifier 130 is exhausted to the printed board 180 through the conductors and the bumps. Specifically, heat generated at the first carrier amplifier 120 is exhausted through the first conductor 160 and the first bump 161 to the printed board 180. Furthermore, heat generated at the first carrier amplifier 120 is exhausted through the semiconductor substrate 150, the second conductor 170 and the second bump 171 to the printed board 180.

Here, in the power amplification circuit according to the comparative example, air is present between the carrier amplifier 1110 and the peak amplifier 1210. Thus, heat generated at the carrier amplifier 1110 is hardly transferred toward the peak amplifier 1210. Thus, in the power amplification circuit according to the comparative example, heat generated at the carrier amplifier 1110 is exhausted only by a route through the conductor 1130 and the bump 1140.

That is, in the power amplification circuit 100, compared with the power amplification circuit according to the comparative example, in order to exhaust heat generated at the first carrier amplifier 120, the second conductor 170 and the second bump 171 near the first peak amplifier 130 can be used. Therefore, in the power amplification circuit 100, compared with the power amplification circuit according to the comparative example, routes regarding heat can be increased. Thus, an increase in temperature of the first carrier amplifier 120 can be suppressed. With this, degradation in characteristics of the first carrier amplifier 120 can be suppressed. Also, it is not required to match the electrical characteristics between the first carrier amplifier 120 and the first peak amplifier 130, and the number of man-hours for pairing can be reduced. Also, when a bias circuit (not depicted in the drawing) for biasing the first peak amplifier 130 is provided on the same semiconductor substrate 150 as that of the first carrier amplifier 120 and the first peak amplifier 130, the bias circuit can detect an increase in temperature of the first carrier amplifier 120. This allows the bias circuit to operate in accordance with an increase in temperature of the first carrier amplifier 120. Thus, amplification efficiency of the power amplification circuit 100 can be improved.

Figure 3:
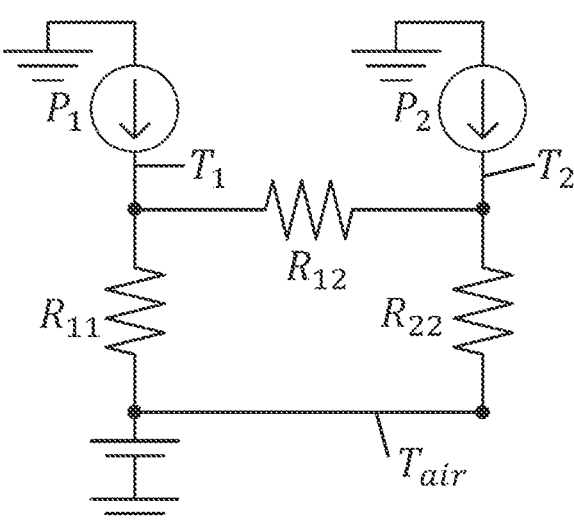
FIG. 3 is a diagram depicting a thermal equivalent circuit in the power amplification circuit according to Embodiment 1.

With reference to FIG. 3, heat exhaustion at the power amplification circuit 100 is described by using a thermal equivalent circuit. FIG. 3 is a diagram depicting a thermal equivalent circuit in the power amplification circuit 100 according to Embodiment 1. "$P_1$" indicates a heat source indicated by power consumption of the first carrier amplifier 120. "$P_2$" indicates a heat source indicated by power consumption of the first peak amplifier 130. "$R_{ii}$" indicates a direct thermal resistance of each amplifier. "$R_{ij}$" ($i \neq j$) indicates a thermal resistance indicating thermal coupling between the respective amplifiers. "$T_1$" indicates a temperature of the first carrier amplifier 120. "$T_2$" indicates a temperature of the first peak amplifier 130. "$T_{air}$" indicates, for example, an environmental temperature. The temperature of each amplifier in the thermal equivalent circuit depicted in FIG. 3 is calculated with Equation (1).

$$\begin{bmatrix} T_1 \\ T_2 \end{bmatrix} = \begin{bmatrix} \dfrac{R_{11}(R_{12} + R_{22})}{R_{11} + R_{12} + R_{22}} & \dfrac{R_{11}R_{22}}{R_{11} + R_{12} + R_{22}} \\ \dfrac{R_{11}R_{22}}{R_{11} + R_{12} + R_{22}} & \dfrac{R_{22}(R_{12} + R_{11})}{R_{11} + R_{12} + R_{22}} \end{bmatrix} \begin{bmatrix} P_1 \\ P_2 \end{bmatrix} + \begin{bmatrix} T_{air} \\ T_{air} \end{bmatrix} \quad (1)$$

Here, as one example, when the first peak amplifier 130 does not consume power in the Doherty amplification circuit (for example, $P_2=0$), the temperature "$T_1$" of the first carrier amplifier 120 is calculated with Equation (2).

$$T_1 \cong \frac{R_{11}(R_{12} + R_{22})}{R_{11} + R_{12} + R_{22}} P_1 + T_{air} \quad (2)$$

As depicted in Equation (2), as "$R_{12}$" decreases in comparison with "$R_{11}$", the temperature $T_1$ of the first carrier amplifier 120 decreases.

Figure 4:
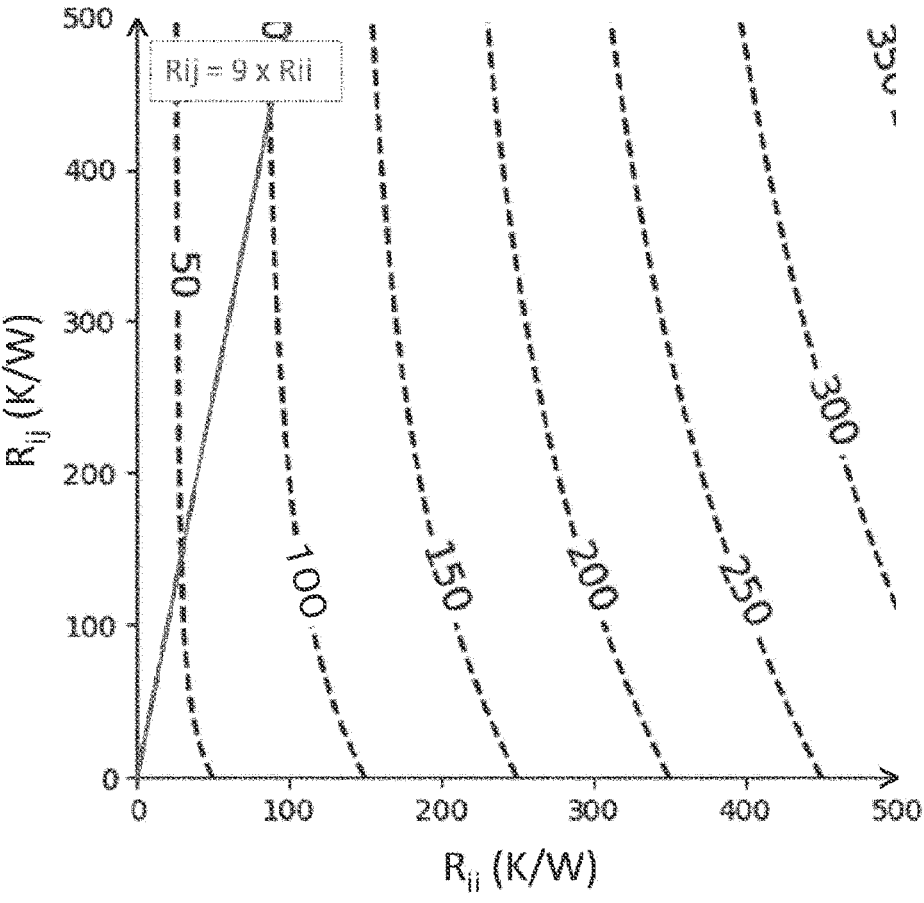
FIG. 4 is a graph depicting a temperature distribution of the first carrier amplifier.

Here, when the environmental temperature $T_{air}$ is 25° C. and only the first carrier amplifier 120 consumes power of 1 W, the result of calculation of the temperature of the first carrier amplifier 120 is depicted in FIG. 4. FIG. 4 is a graph depicting a temperature distribution of the first carrier amplifier 120. In FIG. 4, the X axis is taken as "$R_{ii}$", the Y axis is taken as "$R_{ij}$", and a broken line indicates a relation between "$R_{ii}$" and "$R_{ij}$" corresponding to the temperature of the first carrier amplifier 120.

In FIG. 4, it is indicated that the temperature of the carrier amplifier decreases when the thermal resistance "$R_{ij}$" indicating thermal coupling between the amplifiers is sufficiently small, compared with the thermal resistance of a thermal path of each amplifier. Specifically, in FIG. 4, it is indicated that, for example, based on $R_{ij}=9 \times R_{ii}$ indicated by a solid line, the temperature of the first carrier amplifier 120 falls below 100° C. indicated by a broken line when $R_{ij} < 9 \times R_{ii}$. Thus, in the power amplification circuit 100, $R_{ij} < 9 \times R_{ii}$ is desirable.

That is, in the power amplification circuit 100, by strengthening thermal coupling between the carrier amplifier and the peak amplifier (decreasing $R_{ij}$), heat generated at the carrier amplifier can be transferred to a peak amplifier side. With this, heat generated at the carrier amplifier is exhausted through the conductor and the bump on the peak amplifier side. Thus, an increase in temperature of the carrier amplifier can be suppressed.

Modification 1

Figure 5:
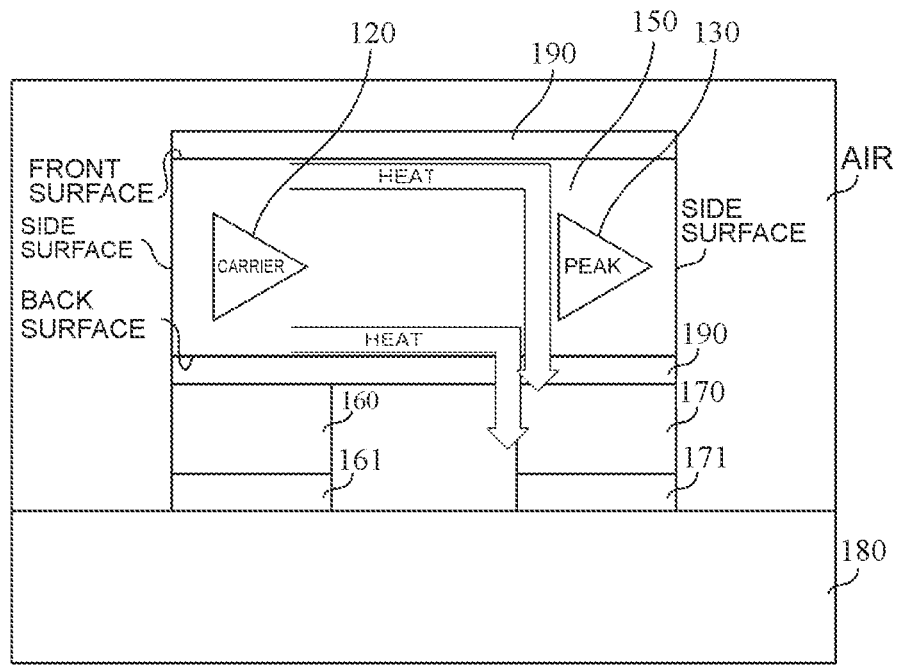
FIG. 5 is a diagram depicting Modification 1 of the arrangement and structure of the first carrier amplifier and the first peak amplifier in the power amplification circuit according to Embodiment 1 when viewed in the cross section.

With reference to FIG. 5, a general outline of Modification 1 of the arrangement and structure of the first carrier amplifier 120 and the first peak amplifier 130 in the power amplification circuit 100 is described. FIG. 5 is a diagram depicting Modification 1 of the arrangement and structure of the first carrier amplifier 120 and the first peak amplifier 130 in the power amplification circuit 100 according to Embodiment 1 when viewed in the cross section. In FIG. 5, one example of an exhaust heat route added to the exhaust heat route depicted in FIG. 2 is indicated by an arrow.

As depicted in FIG. 5, in Modification 1, a thermally conductive member 190 is provided to a front surface of the semiconductor substrate 150 of the power amplification circuit 100 where each amplifier is formed and a back surface opposite to the front surface of the semiconductor substrate 150. The thermally conductive member 190 is formed of a member having a thermal conductivity higher than that of the semiconductor substrate 150. The thermally conductive member 190 is formed of, for example, copper, aluminum, gold, a carbon-based material (for example, graphite sheet or the like), or the like. With this, in the power amplification circuit 100, the thermal resistance "$R_{ij}$" in the thermal equivalent circuit can be further decreased. Thus, heat generated at the first carrier amplifier 120 can be easily transferred to the first peak amplifier 130 side. Therefore, in the power amplification circuit 100, an increase in temperature of the first carrier amplifier 120 can be further suppressed. With this, degradation in characteristics of the first carrier amplifier 120 can be suppressed.

Note that while the thermally conductive member 190 is provided to the front surface and the back surface of the semiconductor substrate 150 in FIG. 5, this is not meant to be restrictive. For example, the thermally conductive member 190 may be provided to at least either one of the front surface and the back surface of the semiconductor substrate 150. Also, for example, the thermally conductive member 190 may be provided to at least part of the front surface and the back surface of the semiconductor substrate 150. Also, for example, the thermally conductive member 190 may be provided to an intermediate layer of the semiconductor substrate 150 when the semiconductor substrate 150 is formed of multiple layers. Also, for example, the thermally conductive member 190 may be provided to at least part of at least one side surface of the semiconductor substrate 150.

Modification 2

Figure 6:
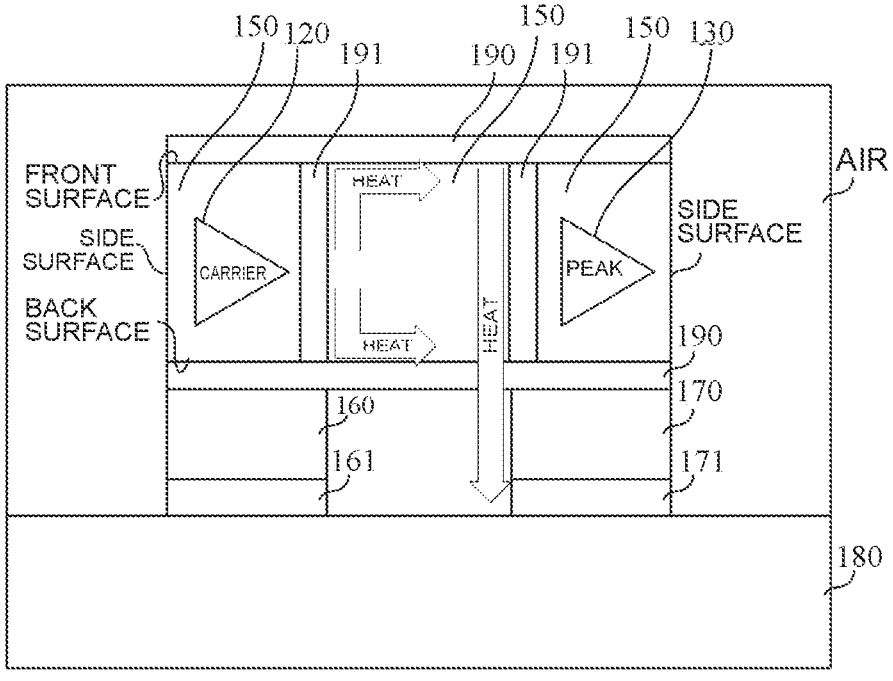
FIG. 6 is a diagram depicting Modification 2 of the arrangement and structure of the first carrier amplifier and the first peak amplifier in the power amplification circuit according to Embodiment 1 when viewed in the cross section.

With reference to FIG. 6, a general outline of Modification 2 of the arrangement and structure of the first carrier amplifier 120 and the first peak amplifier 130 in the power amplification circuit 100 is described. FIG. 6 is a diagram depicting Modification 2 of the arrangement and structure of the first carrier amplifier 120 and the first peak amplifier 130 in the power amplification circuit 100 according to Embodiment 1 when viewed in the cross section. In FIG. 6, one example of an exhaust heat route added to the exhaust heat route depicted in FIG. 2 and FIG. 5 is indicated by an arrow.

As depicted in FIG. 6, in Modification 2, the thermally conductive member 190 and a thermally conductive member 191 penetrating through the front surface and the back surface of the semiconductor substrate 150 are provided. The thermally conductive member 191 is, for example, a via formed of a member having a thermal conductivity higher than that of the semiconductor substrate 150. The thermally conductive member 191 is formed of, for example, copper, aluminum, gold, a carbon-based material (for example, graphite sheet or the like), or the like. The thermally conductive member 191 may be the same member as the thermally conductive member 190, or does not have to be so. The thermally conductive member 191 is desirably provided near, for example, the first carrier amplifier 120 and the first peak amplifier 130. Also, thermally conductive member 191 is desirably connected to, for example, the thermally conductive member 190. For example, one or more thermally conductive members 191 are provided between the first carrier amplifier 120 and the first peak amplifier 130. With this, in the power amplification circuit 100, the thermal resistance "$R_{ij}$" in the thermal equivalent circuit can be further decreased. Thus, heat generated at the first carrier amplifier 120 can be easily transferred to the first peak amplifier 130 side.

Specifically, heat generated at the first carrier amplifier 120 is exhausted to the printed board 180 mainly through the first conductor 160 and the first bump 161. That is, an increase in temperature of a region (near the back surface) of the semiconductor substrate 150 near the first carrier amplifier 120 and close to the printed board 180 increases. On the other hand, an increase in temperature of a region (near the front surface) of the semiconductor substrate 150 near the first carrier amplifier 120 and away from the printed board 180 is not large. Thus, in the power amplification circuit 100, with the thermally conductive member 190 provided to the front surface and the thermally conductive member 190 provided to the back surface being connected by the thermally conductive member 191, heat can be moved from a region with a large increase in temperature to a region with a not large increase in temperature. With this, the power amplification circuit 100 can suppress an increase in temperature of the first carrier amplifier 120. Thus, degradation in characteristics of the first carrier amplifier 120 can be suppressed.

Note that while it is depicted in FIG. 6 that the thermally conductive member 191 penetrates a space between the front surface and the back surface of the semiconductor substrate 150, this is not meant to be restrictive. For example, without necessarily penetrating through the semiconductor substrate 150, the thermally conductive member 191 may be provided from the front surface or the back surface toward the inside of the semiconductor substrate 150.

Structure of Power Amplification Circuit 200 According to Embodiment 2

Figure 7:
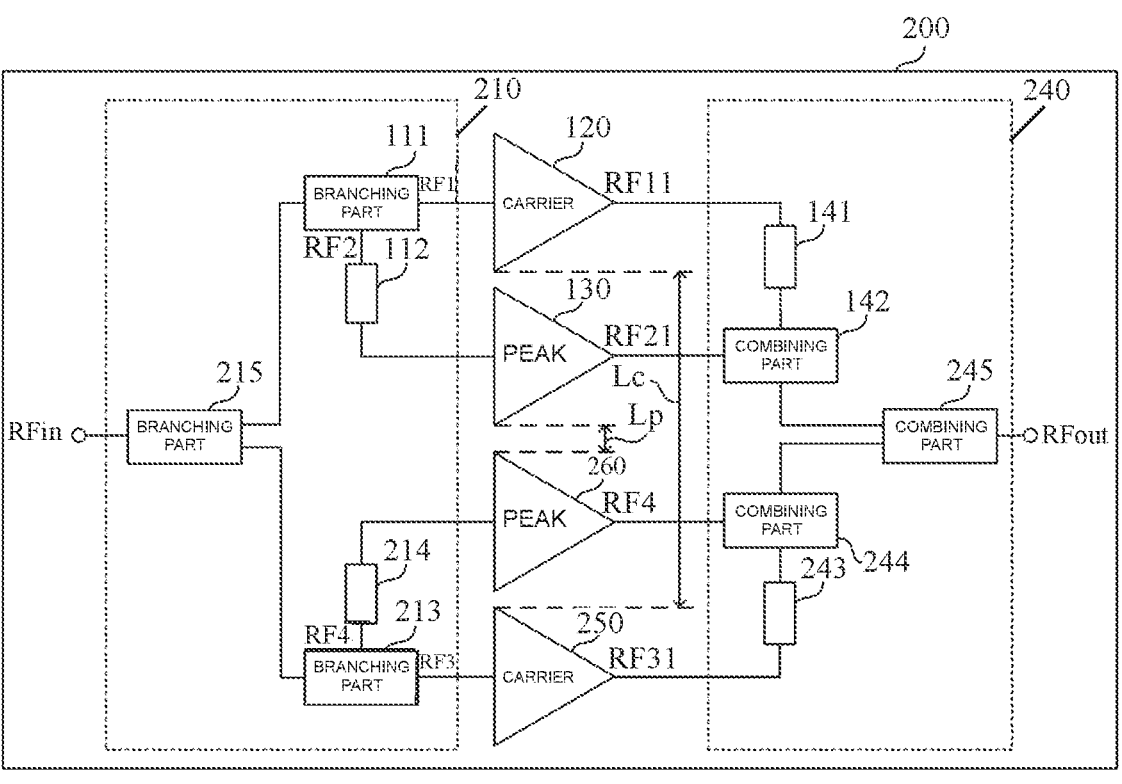
FIG. 7 is a structural diagram depicting one example of the structure of a power amplification circuit according to Embodiment 2 when viewed in plan view.

With reference to FIG. 7, the structure of a power amplification circuit 200 according to Embodiment 2 is described. FIG. 7 is a structural diagram depicting one example of the structure of the power amplification circuit 200 according to Embodiment 2 when viewed in plan view. As depicted in FIG. 7, the power amplification circuit 200 includes, for example, a power splitter 210, a Doherty amplifier configured to include the first carrier amplifier 120 and the first peak amplifier 130, a Doherty amplifier configured to include a second carrier amplifier 250 and a second peak amplifier 260, and a combiner 240.

Since the second carrier amplifier 250 and the second peak amplifier 260 are identical to the first carrier amplifier 120 and the first peak amplifier 130, their description is omitted. The power splitter 210 further includes, compared with the power splitter 110, a branching part 213, a third phase shifter 214, and a branching part 215. Since the branching part 213 is identical to the branching part 111 and the third phase shifter 214 is identical to the first phase shifter 112, their description is omitted. The branching part 215 may be, for example, a balun, a distributed parameter circuit, such as a coupler of a coupling line of 3 dB, a Wilkinson-type power splitter, a web-type power splitter, or the like. The combiner 240 further includes, compared with the combiner 140, a fourth phase shifter 243, a combining part 244, and a combining part 245. Since the fourth phase shifter 243 is identical to the second phase shifter 141 and the combining part 244 is identical to the combining part 142, their description is omitted. The combining part 245 combines a signal outputted from the combining part 142 and a signal outputted from the combining part 244 to output the signal RFout.

The power amplification circuit 200 according to Embodiment 2 has the first carrier amplifier 120 and the first peak amplifier 130 formed on the same semiconductor substrate 150. Also, the power amplification circuit 200 has the second carrier amplifier 250 and the second peak amplifier 260 formed on the same semiconductor substrate. Furthermore, the power amplification circuit 200 may have, for example, the first carrier amplifier 120, the first peak amplifier 130, the second carrier amplifier 250, and the second peak amplifier 260 formed on the same semiconductor substrate. With this, heat generated at the first carrier amplifier 120 is easily transferred to a first peak amplifier 130 side, and heat generated at the second carrier amplifier 250 is easily transferred to a second peak amplifier 260 side. Thus, the power amplification circuit 200 can suppress an increase in temperature of the first carrier amplifier 120 and the second carrier amplifier 250. With this, degradation in characteristics of the first carrier amplifier 120 and the second carrier amplifier 250 can be suppressed. Note that the power amplification circuit 200 may have, for example, at least three of the first carrier amplifier 120, the first peak amplifier 130, the second carrier amplifier 250, and the second peak amplifier 260 formed on the same semiconductor substrate. With this, with heat generated at at least the first carrier amplifier 120 or the second carrier amplifier 250 transferred to the first peak amplifier 130 side or the second peak amplifier 260 side, an increase in temperature of at least the first carrier amplifier 120 or the second carrier amplifier 250 can be suppressed.

Also, the power amplification circuit 200 according to Embodiment 2 may have a structure described in Modification 1 of the arrangement and structure of the first carrier amplifier 120 and the first peak amplifier 130 or Modification 2 of the arrangement and structure of the first carrier amplifier 120 and the first peak amplifier 130. The power amplification circuit 200 according to Embodiment 2 may have a similar structure as to the arrangement and structure of the second carrier amplifier 250 and the second peak amplifier 260. With this, the power amplification circuit 200 can further suppress an increase in temperature of the first carrier amplifier 120 and the second carrier amplifier 250.

Furthermore, as depicted in FIG. 7, the power amplification circuit 200 according to Embodiment 2 has, for example, the first peak amplifier 130 arranged adjacently to the first carrier amplifier 120. The second peak amplifier 260 is arranged adjacently to the first peak amplifier 130 that is opposite to the first carrier amplifier 120. The second carrier amplifier 250 is arranged adjacently to the second peak amplifier 260 that is opposite to the first peak amplifier 130. That is, in the power amplification circuit 200, the respective amplifiers are arranged so that a distance between the first carrier amplifier 120 and the second carrier amplifier 250 (hereinafter referred to as a distance Lc) is longer than a distance between the first peak amplifier 130 and the second peak amplifier 260 (hereinafter referred to as a distance Lp). With this, the power amplification circuit 200 can further suppress an increase in temperature of the first carrier amplifier 120 and the second carrier amplifier 250. Note that the arrangement of the respective amplifiers in the power amplification circuit 200 is not limited to the above. In the power amplification circuit 200, for example, the carrier amplifiers and the peak amplifiers may be arranged so as to be alternately adjacent to one another so that the distance Lc is longer than the distance Lp. Here, the distance Lc may be, for example, a distance between an element closest to the second carrier amplifier 250 among the elements configuring the first carrier amplifier 120 and an element closest to the first carrier amplifier 120 among the elements configuring the second carrier amplifier 250. The distance Lc may be, for example, a distance between an element closest to the second peak amplifier 260 among the elements configuring the first peak amplifier 130 and an element closest to the first peak amplifier 130 among the elements configuring the second peak amplifier 260.

Figure 8:
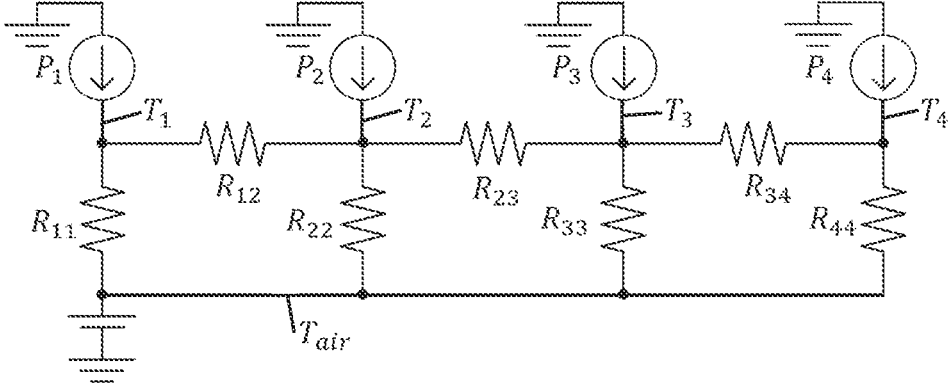
FIG. 8 is a diagram depicting a thermal equivalent circuit in the power amplification circuit according to Embodiment 2.

With reference to FIG. 8, by using a thermal equivalent circuit, it is described that an increase in temperature of the first carrier amplifier 120 and the second carrier amplifier 250 can be suppressed. FIG. 8 is a diagram depicting a thermal equivalent circuit in the power amplification circuit 200 according to Embodiment 2. "$P_3$" indicates a heat source indicated by power consumption of the second peak amplifier 260. "$P_4$" indicates a heat source indicated by power consumption of the second carrier amplifier 250. "$T_3$" indicates a temperature of the second peak amplifier 260. "$T_4$" indicates a temperature of the second carrier amplifier 250. Note in FIG. 8 that thermal coupling between not adjacent amplifiers is sufficiently smaller than thermal coupling between adjacent amplifiers and thus is ignored. Also, for convenience, description is made to a case in which the first peak amplifier 130 and the second peak amplifier 260 do not consume power in the power amplification circuit 200.

In the thermal equivalent circuit depicted in FIG. 8, description is made to a precondition for exhausting heat generated at the carrier amplifiers 120 and 250 in the power amplification circuit 200 by using direct exhaust heat paths of the peak amplifiers 130 and 260. In this point, a carrier combined thermal resistance obtained by combining heat resistances between the first carrier amplifier 120 and the second carrier amplifier 250 is $R_{12}+R_{23}+R_{34}$. On the other hand, a peak combined thermal resistance obtained by combining heat resistances between the first peak amplifier 130 and the second peak amplifier 260 is $R_{23}$. Here, when the carrier combined thermal resistance is smaller than the peak combined thermal resistance, heat coupling occurs between the carrier amplifiers 120 and 250, and it is thus impossible to suppress an increase in temperature of the carrier amplifiers 120 and 250. Thus, it is set, as a requirement, that the carrier combined thermal resistance is larger than the peak combined thermal resistance. That is, it is set, as a requirement, that $R_{12}+R_{34}>0$ is satisfied.

Also, when direct thermal resistances $R_{11}$ and $R_{44}$ of the carrier amplifiers 120 and 250 are significantly small, compared with thermal resistances $R_{12}+R_{22}$ and $R_{34}+R_{33}$ of direct exhaust heat paths of the peak amplifiers 130 and 260 for exhausting heat generated at the carrier amplifiers 120 and 250, it is impossible to suppress an increase in temperature of the carrier amplifiers 120 and 250. Thus, it is set, as requirements, that the thermal resistance $R_{11}$ is not significantly small, compared with the thermal resistance $R_{12}+R_{22}$, and the thermal resistance $R_{44}$ is not significantly small, compared with the thermal resistance $R_{34}+R_{33}$.

In the following, by taking these requirements as preconditions, suppression of an increase in temperature of the carrier amplifiers 120 and 250 is described.

As depicted in FIG. 8, heat generated from the first carrier amplifier 120 is classified into one exhausted through $R_{11}$ and one exhausted through $R_{12}$. Heat generated from the second carrier amplifier 250 is classified into one exhausted through $R_{44}$ and one exhausted through R34. That is, a heat flow $P_{11}$ in which the first carrier amplifier 120 is heat-exhausted through R11 is $(T_1-T_{air})/R_{11}$. On the other hand, a heat flow $P_{12}$ heat-exhausted through the direct thermal resistance R22 of the first peak amplifier 130 is $(T_1-T_{air})/(R_{22}+R_{12})$. Here, when the heat flow $P_{12}$ is non-negligibly large with respect to the heat flow $P_{11}$, heat generated at the first carrier amplifier 120 is exhausted through the direct exhaust heat route of the first peak amplifier 130. With this, an increase in temperature of the first carrier amplifier 120 can be suppressed. The same goes for the relation between the second carrier amplifier 250 and the second peak amplifier 260.

Figure 9:
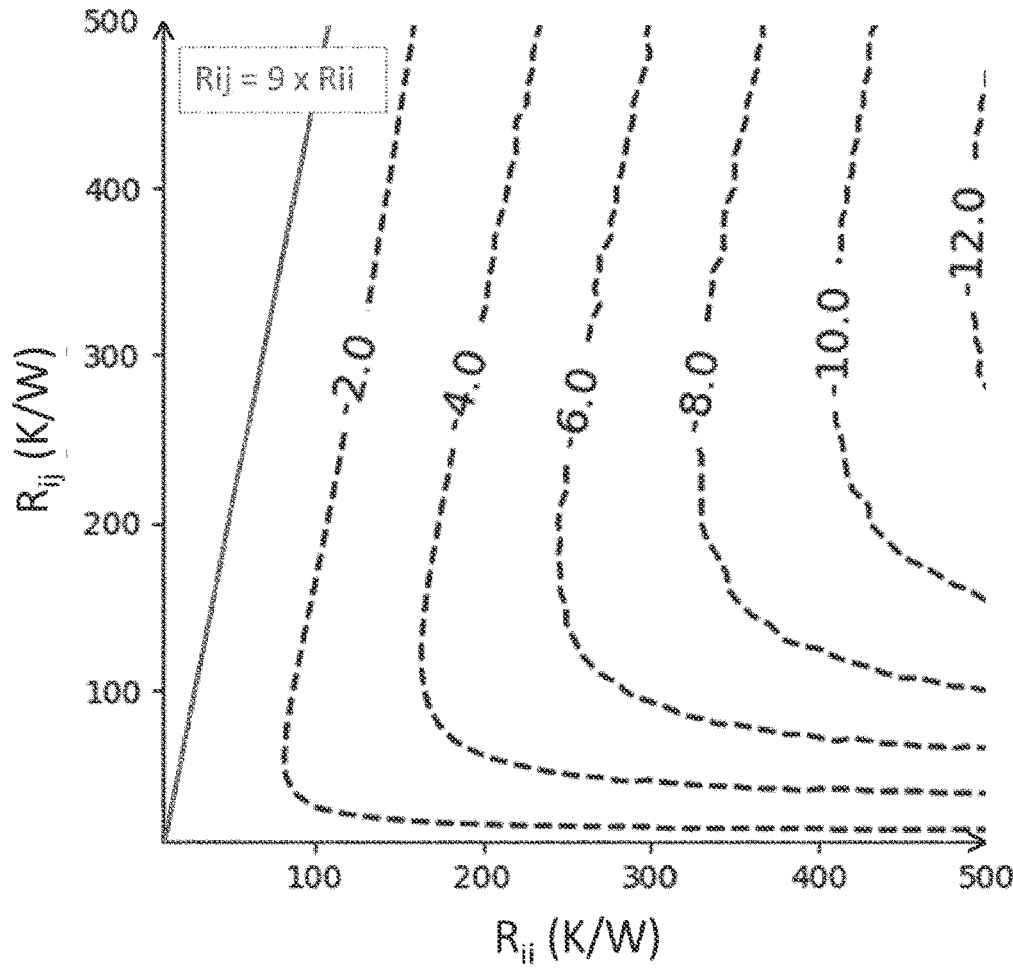
FIG. 9 is a graph depicting a temperature distribution of a carrier amplifier in the power amplification circuit according to Embodiment 2.

Here, with reference to FIG. 9, an effect of temperature suppression in the power amplification circuit 200 is specifically described. FIG. 9 is a graph indicating temperature decrease amounts of the carrier amplifiers 120 and 250 in the power amplification circuit 200 according to Embodiment 2. A temperature as a reference for temperature decrease is a temperature of the carrier amplifier when the amplifier is set to be in a state of carrier, peak, carrier, and peak. In FIG. 9, the X axis is taken as "$R_{ii}$", the Y axis is taken as "$R_{ij}$", and a broken line indicates a relation between "$R_{ii}$" and "$R_{ij}$" corresponding to temperature decreases of the carrier amplifiers 120 and 250. In FIG. 9, it is indicated that the temperature of the carrier amplifier decreases when the thermal resistance "$R_{ij}$" indicating thermal coupling between the amplifiers is sufficiently small, compared with the thermal resistance of a thermal path of each amplifier. Specifically, in FIG. 9, it is indicated that, for example, based on $R_{ij}=9 \times R_{ii}$ indicated by a solid line, the temperature of the carrier amplifiers 120 and 250 can be decreased by 2° C. when $R_{ij}<9 \times R_{ii}$. That is, depending on the relation between "$R_{ii}$" and "$R_{ij}$", a decrease by 12° C. may be possible. Thus, an increase in temperature of the carrier amplifiers 120 and 250 can be suppressed by 10° C. or more. Thus, in the power amplification circuit 200, $R_{ij}<9 \times R_{ii}$ is desirable. That is, with the arrangement of the respective amplifiers of the power amplification circuit 200 according to Embodiment 2, heat generated at the first carrier amplifier 120 and the second carrier amplifier 250 can be efficiently exhausted through the direct exhaust heat routes of the first peak amplifier 130 and the second peak amplifier 260.

Power Amplification Circuit 300 According to Embodiment 3

Figure 10:
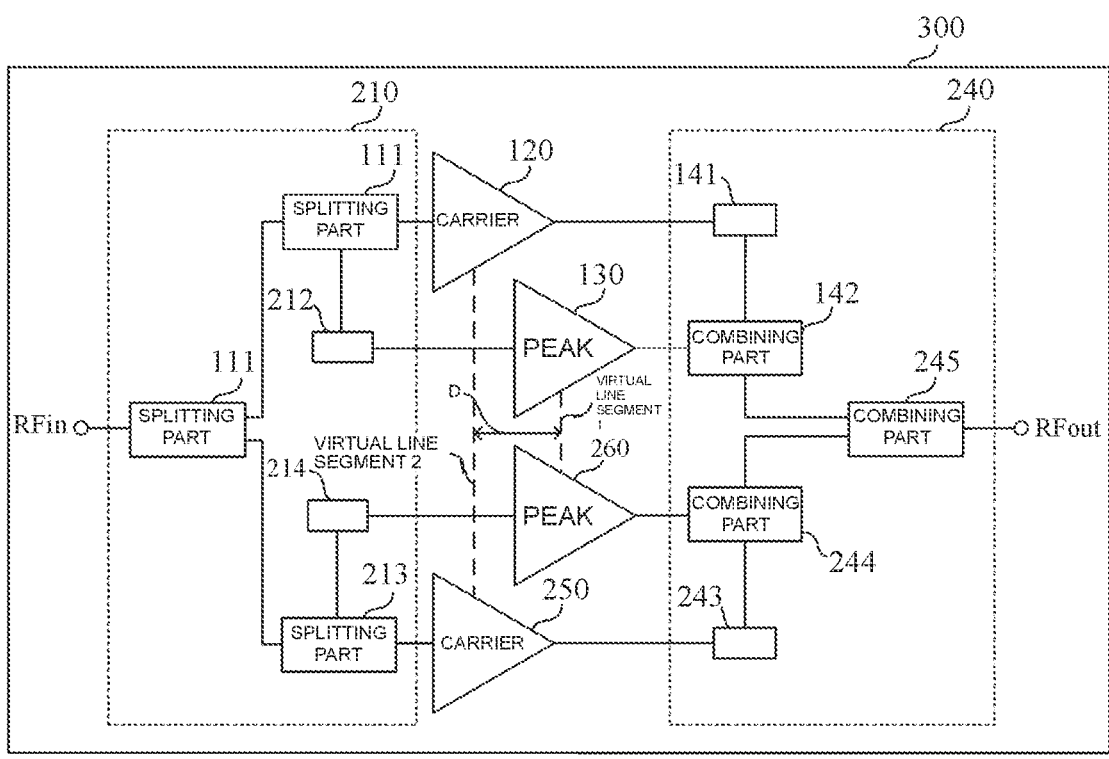
FIG. 10 is a structural diagram depicting one example of the structure of a power amplification circuit according to Embodiment 3 when viewed in plan view.

With reference to FIG. 10, the structure of a power amplification circuit 300 according to Embodiment 3 is described. FIG. 10 is a structural diagram depicting one example of the structure of the power amplification circuit 300 according to Embodiment 3 when viewed in plan view. As depicted in FIG. 10, compared with the power amplification circuit 200 according to Embodiment 2, the power amplification circuit 300 has a different arrangement of the first carrier amplifier 120 and the second carrier amplifier 250. Note that, in the power amplification circuit 300, as with the power amplification circuit 200 according to Embodiment 2, the first carrier amplifier 120, the second carrier amplifier 250, the first peak amplifier 130, and the second peak amplifier 260 are arranged so that the distance Lc is longer than the distance Lp.

As depicted in FIG. 10, the power amplification circuit 300 is configured so that a virtual line segment 1 connecting the first peak amplifier 130 and the second peak amplifier 260 and a virtual line segment 2 connecting the first carrier amplifier 120 and the second carrier amplifier 250 do not overlap. In other words, in plan view, the virtual line segment 1 is shifted with respect to the virtual line segment 2 in parallel by a distance D. Here, the virtual line segment 1 is, for example, a virtual line segment connecting the center of a region in the first peak amplifier 130 in which the temperature becomes highest and the center of a region in the second peak amplifier 260 in which the temperature becomes highest. Also, the virtual line segment 2 is, for example, a virtual line segment connecting the center of a region in the first carrier amplifier 120 in which the temperature becomes highest and the center of a region in the second carrier amplifier 250 in which the temperature becomes highest. With this, by arranging the first carrier amplifier 120 and the second carrier amplifier 250 so that the distance therebetween is short, the size of the power amplification circuit 300 can be decreased. Also, since flexibility in the arrangement of the first carrier amplifier 120 and the second carrier amplifier 250 can be increased, circuit designing becomes easy.

Conclusion

The power amplification circuit 100 according to Embodiment 1 includes: the power splitter 110 which splits the input signal RFin into the signal RF1 (first signal), the signal RF2 (second signal), a signal RF3 (third signal), and a signal RF4 (fourth signal); the first carrier amplifier 120 which amplifies the signal RF1 (first signal) to output the amplified signal RF11 (first amplified signal); the first peak amplifier 130 which amplifies the signal RF2 (second signal) when a power level of the signal RF2 (second signal) is larger than or equal to a predetermined power level to output the amplified signal RF21 (second amplified signal); the second carrier amplifier 250 which amplifies the signal RF3 (third signal) to output an amplified signal RF31 (third amplified signal); the second peak amplifier 260 which amplifies the signal RF4 (fourth signal) when a power level of the signal RF4 (fourth signal) is larger than or equal to a predetermined power level to output an amplified signal RF41 (fourth amplified signal); and the combiner which combines the amplified signal RF11 (first amplified signal), the amplified signal RF21 (second amplified signal), the amplified signal RF31 (third amplified signal), and the amplified signal RF41 (fourth amplified signal). At least three among the first carrier amplifier 120, the first peak amplifier 130, the second carrier amplifier 250, and the second peak amplifier 260 are provided to a same semiconductor substrate 150. With this, the power amplification circuit 100 can efficiently exhaust heat generated at the first carrier amplifier 120 or the second carrier amplifier 250. Thus, an increase in temperature of the first carrier amplifier 120 or the second carrier amplifier 250 can be suppressed. Thus, characteristics degradation of the first carrier amplifier 120 or the second carrier amplifier 250 can be suppressed.

Also, the power amplification circuit 100 according to Embodiment 1 has the first carrier amplifier 120, the first peak amplifier 130, the second carrier amplifier 250, and the second peak amplifier 260 provided to the same semiconductor substrate. With this, in the power amplification circuit 100, heat generated at the first carrier amplifier 120 and the second carrier amplifier 250 can be efficiently exhausted. Thus, an increase in temperature of the first carrier amplifier 120 and the second carrier amplifier 250 can be suppressed. Thus, characteristics degradation of the first carrier amplifier 120 and the second carrier amplifier 250 can be suppressed.

Also, the power amplification circuit 100 according to Embodiment 1 further includes a plurality of conductors provided between a surface, where the semiconductor substrate 150 is arranged, of a substrate where the semiconductor substrate 150 is arranged and the semiconductor substrate 150. With this, heat generated at the first carrier amplifier 120 is exhausted through the plurality of conductors. Thus, an increase in temperature of the first carrier amplifier 120 can be suppressed.

Also, in the power amplification circuit 100 according to Embodiment 1, the plurality of conductors include the first conductor 160 electrically connected to the first carrier amplifier 120 and the second conductor 170 electrically connected to the first peak amplifier 130. With this, heat generated at the first carrier amplifier 120 is efficiently exhausted through the plurality of conductors. Thus, an increase in temperature of the first carrier amplifier 120 can be suppressed.

Also, the power amplification circuit 100 according to Embodiment 1 further includes the heat-transferring thermally conductive member 190 (first thermally conductive member) provided to at least part of at least one surface of the semiconductor substrate 150. With this, heat generated at the first carrier amplifier 120 is efficiently transferred through the thermally conductive member 190 to the first peak amplifier 130 side. Thus, an increase in temperature of the first carrier amplifier 120 can be suppressed.

Also, the power amplification circuit 100 according to Embodiment 1 further includes the thermally conductive member 191 (second thermally conductive member) provided between the first carrier amplifier 120 and the first peak amplifier 130 from at least one surface of the semiconductor substrate 150 toward inside the semiconductor substrate 150. With this, heat can be moved from a region in the semiconductor substrate 150 in which an increase in temperature is large to a region in which an increase in temperature is not large. Thus, an increase in temperature of the first carrier amplifier 120 can be suppressed.

Also, in the power amplification circuit 100 according to Embodiment 1, the thermally conductive member 191 (second thermally conductive member) is provided from one surface of the semiconductor substrate 150 over another surface opposite to the one surface. With this, heat can be efficiently moved from a region in the semiconductor substrate 150 in which an increase in temperature is large to a region in which an increase in temperature is not large. Thus, an increase in temperature of the first carrier amplifier 120 can be further suppressed.

A plurality of said thermally conductive members 191 (second thermally conductive members) of the power amplification circuit 100 according to Embodiment 1 are provided. With this, heat can be efficiently moved from a region in the semiconductor substrate 150 in which an increase in temperature is large to a region in which an increase in temperature is not large. Thus, an increase in temperature of the first carrier amplifier 120 can be further suppressed.

Also, in the power amplification circuit 200 according to Embodiment 2, when viewed in plan view, the first carrier amplifier 120, the first peak amplifier 130, and then the second carrier amplifier 250 are aligned in this order. With this, an increase in temperature of the first and second carrier amplifiers 120 and 250 can be suppressed. Thus, characteristics degradation of the first carrier amplifier 120 and the second carrier amplifier 250 can be suppressed.

Also, in the power amplification circuit 200 according to Embodiment 2, when viewed in plan view, the first carrier amplifier 120, the second peak amplifier 260, and then the second carrier amplifier 250 are aligned in this order. With this, an increase in temperature of the first and second carrier amplifiers 120 and 250 can be suppressed. Thus, characteristics degradation of the first carrier amplifier 120 and the second carrier amplifier 250 can be suppressed.

Also, in the power amplification circuit 200 according to Embodiment 2, when viewed in plan view, the first carrier amplifier 120, the first peak amplifier 130, the second peak amplifier 260, and then the second carrier amplifier 250 are aligned in this order. With this, a large distance between the first and second carrier amplifiers 120 and 250 can be taken, and heat generated at the first and second carrier amplifiers 120 and 250 can be efficiently exhausted through the first and second peak amplifiers 130 and 260. Thus, with an increase in temperature of the first and second carrier amplifiers 120 and 250 suppressed, characteristics degradation of the first carrier amplifier 120 and the second carrier amplifier 250 can be suppressed.

Also, in the power amplification circuit 200 according to Embodiment 2, the first carrier amplifier 120, the first peak amplifier 130, the second carrier amplifier 250, and the second peak amplifier 260 are arranged so that a first distance between the first carrier amplifier 120 and the second carrier amplifier 250 is longer than a second distance between the first peak amplifier 130 and the second peak amplifier 260. With this, heat generated at the first carrier amplifier 120 and the second carrier amplifier 250 can be efficiently exhausted through the exhaust heat routes of the first peak amplifier 130 and the second peak amplifier 260.

Also, in the power amplification circuit 300 according to Embodiment 3, the first carrier amplifier 120, the first peak amplifier 130, the second carrier amplifier 250, and the second peak amplifier 260 are arranged so that the virtual line segment 1 connecting the first carrier amplifier 120 and the second carrier amplifier 250 and the virtual line segment 2 connecting the first peak amplifier 130 and the second peak amplifier 260 do not overlap. With this, heat generated at the first carrier amplifier 120 and the second carrier amplifier 250 can be efficiently exhausted, and the size of the power amplification circuit 300 can be decreased.

Note that the above-described embodiments are to facilitate understanding of the present disclosure and are not to limit the present disclosure for interpretation. The present disclosure can be changed/improved without necessarily deviating from its gist and includes its equivalents. That is, those obtained by a person skilled in the art adding an appropriate design change to the embodiments are also included in the scope of the present disclosure as long as they have the features of the present disclosure. The elements included in the embodiments, their arrangement, and so forth are not limited to those exemplarily described and can be changed as appropriate.

REFERENCE SIGNS LIST

100, 200 power amplification circuit
110, 210 power splitter
120 first carrier amplifier
130 first peak amplifier
150 semiconductor substrate
250 second carrier amplifier
260 second peak amplifier

The invention claimed is:
1. A power amplification circuit comprising:
a power splitter configured to split an input signal into a first signal, a second signal, a third signal, and a fourth signal;
a first carrier amplifier configured to amplify the first signal to output a first amplified signal;
a first peak amplifier configured to amplify the second signal when a power level of the second signal is larger than or equal to a first predetermined power level to output a second amplified signal;
a second carrier amplifier configured to amplify the third signal to output a third amplified signal;
a second peak amplifier configured to amplify the fourth signal when a power level of the fourth signal is larger than or equal to a second predetermined power level to output a fourth amplified signal;

a combiner circuit configured to combine the first amplified signal, the second amplified signal, the third amplified signal, and the fourth amplified signal; and a second thermally conductive member, wherein at least three among the first carrier amplifier, the first peak amplifier, the second carrier amplifier, and the second peak amplifier are on a same semiconductor substrate, wherein the first carrier amplifier, the first peak amplifier, the second carrier amplifier, and the second peak amplifier are on the same semiconductor substrate, and wherein the second thermally conductive member is between the first carrier amplifier and the first peak amplifier from at least one surface of the semiconductor substrate toward an inside of the semiconductor substrate.

2. The power amplification circuit according to claim 1, wherein the first carrier amplifier, the first peak amplifier, the second carrier amplifier, and the second peak amplifier are arranged so that a first distance between the first carrier amplifier and the second carrier amplifier is greater than a second distance between the first peak amplifier and the second peak amplifier.

3. The power amplification circuit according to claim 1, further comprising:

a printed board; and a plurality of conductors between the semiconductor substrate and the printed board.

4. The power amplification circuit according to claim 3, wherein the plurality of conductors comprise a first conductor electrically connected to the first carrier amplifier and a second conductor electrically connected to the first peak amplifier.

5. The power amplification circuit according to claim 1, further comprising:

a first thermally conductive member on at least part of at least one surface of the semiconductor substrate and configured to transfer heat.

6. The power amplification circuit according to claim 2, wherein the first carrier amplifier, the first peak amplifier, the second carrier amplifier, and the second peak amplifier are arranged so that a first virtual line segment that connects the first carrier amplifier and the second carrier amplifier and a second virtual line segment that connects the first peak amplifier and the second peak amplifier do not overlap.

7. The power amplification circuit according to claim 1, wherein the second thermally conductive member is between a first surface of the semiconductor substrate over a second surface that is opposite to the first surface.

8. The power amplification circuit according to claim 7, further comprising:

a plurality of said second thermally conductive members.

9. The power amplification circuit according to claim 1, wherein when viewed in plan view, the first carrier amplifier, the first peak amplifier, and then the second carrier amplifier are aligned in this order.

10. The power amplification circuit according to claim 1, wherein when viewed in plan view, the first carrier amplifier, the second peak amplifier, and then the second carrier amplifier are aligned in this order.

11. The power amplification circuit according to claim 1, wherein when viewed in plan view, the first carrier amplifier, the first peak amplifier, the second peak amplifier, and then the second carrier amplifier are aligned in this order.

12. The power amplification circuit according to claim 3, further comprising:

a first thermally conductive member on at least part of at least one surface of the semiconductor substrate and configured to transfer heat.

13. The power amplification circuit according to claim 4, further comprising:

a first thermally conductive member on at least part of at least one surface of the semiconductor substrate and configured to transfer heat.

* * * * *